United States Patent
Owada et al.

Patent Number: 5,860,122
Date of Patent: Jan. 12, 1999

[54] BACKUP UNIT INCLUDING IDENTIFIER CONVERSION MEANS

[75] Inventors: Kiyoshi Owada, Hirakatashi; Susumu Kobayashi, Osakashi, both of Japan

[73] Assignee: Matsushita Electric Industrial Co., Ltd., Japan

[21] Appl. No.: 747,601

[22] Filed: Nov. 12, 1996

[30] Foreign Application Priority Data

Nov. 14, 1995 [JP] Japan .................................. 07-295832

[51] Int. Cl.⁶ .................................................. G06F 12/16
[52] U.S. Cl. ...................... 711/162; 395/182.04; 707/204
[58] Field of Search ......................... 395/182.03, 182.04, 395/182.13; 711/161, 162; 707/202, 203, 204

[56] References Cited

U.S. PATENT DOCUMENTS

| | | | |
|---|---|---|---|
| 5,274,816 | 12/1993 | Oka | 395/652 |
| 5,327,531 | 7/1994 | Bealkowski et al. | 395/182.04 |
| 5,469,573 | 11/1995 | McGill et al. | 395/712 |
| 5,519,969 | 5/1996 | Payne et al. | 395/652 |
| 5,754,848 | 5/1998 | Hanes | 707/200 |

FOREIGN PATENT DOCUMENTS

| | | |
|---|---|---|
| 0586907 | 3/1994 | European Pat. Off. . |
| 7-56742 | 3/1995 | Japan . |

OTHER PUBLICATIONS

IBM Technical Disclosure Bulletin, vol. 37, No. 7, Jul. 1994, pp. 5–6.
IBM Technical Disclosure Bulletin, vol. 36, No. 10, 1 Oct. 1993, pp. 329–330.
IBM Technical Disclosure Bulletin, vol. 37, No. 10, 1 Oct. 1994 pp. 5–8.

*Primary Examiner*—Tod R. Swann
*Assistant Examiner*—Conley B. King, Jr.
*Attorney, Agent, or Firm*—Parkhurst & Wendel

[57] ABSTRACT

A backup unit comprises a first storage means containing at least one program and a setup file in which the operating environment of that program is written; a second storage means used when the first storage means has a fault; a duplication means for duplicating the program and the setup file contained in the first storage means, into the second storage means; and an identifier conversion means for converting identifiers included in the setup file of the first storage means and relating to the first storage means, into identifiers relating to the second storage means, when the duplication is performed. Therefore, when the operation of an information processor is stopped due to a fault in the first storage means, the second storage means enables temporary operation of the information processor. In addition, it is possible to employ, as the second storage means, a recording medium that is lower in price and writing speed than the first storage means.

6 Claims, 11 Drawing Sheets

Fig.4 (a) setup file before conversion:
setup file for mounting HDD

| # device<br># to mount<br># | device<br>to fsck | mount<br>point | FS<br>type | fsck<br>pass | mount<br>at boot | mount<br>options |
|---|---|---|---|---|---|---|
| /dev/dsk/c0t1d0s0 | /dev/rdsk/c0t1d0s0 | / | ufs | 1 | no | — |
| /dev/dsk/c0t1d0s6 | /dev/rdsk/c0t1d0s6 | /usr | ufs | 1 | no | — |
| /dev/dsk/c0t1d0s7 | /dev/rdsk/c0t1d0s7 | /export/home | ufs | 2 | yes | — |
| /dev/dsk/c0t1d0s1 | — | — | swap | — | no | — |
| /dev/dsk/c0t5d0s2 | /dev/rdsk/c0t5d0s2 | /data1 | ufs | 1 | yes | — | identifiers relating to first external storage unit (braces first four rows)
identifiers relating to third external storage unit (last row)

Fig.4 (b) setup file after conversion:

| # device<br># to mount<br># | device<br>to fsck | mount<br>point | FS<br>type | fsck<br>pass | mount<br>at boot | mount<br>options |
|---|---|---|---|---|---|---|
| /dev/dsk/c0t2d0s0 | /dev/rdsk/c0t2d0s0 | / | ufs | 1 | no | — |
| /dev/dsk/c0t2d0s6 | /dev/rdsk/c0t2d0s6 | /usr | ufs | 1 | no | — |
| /dev/dsk/c0t2d0s7 | /dev/rdsk/c0t2d0s7 | /export/home | ufs | 2 | yes | — |
| /dev/dsk/c0t2d0s1 | — | — | swap | — | no | — |
| /dev/dsk/c0t5d0s2 | /dev/rdsk/c0t5d0s2 | /data1 | ufs | 1 | yes | — | identifiers relating to second external storage unit (converted) (braces first four rows)
identifiers relating to third external storage unit (not converted) (last row)

BACKUP UNIT INCLUDING IDENTIFIER CONVERSION MEANS

FIELD OF THE INVENTION

The present invention relates to a backup unit having a countermeasure against a fault in an external storage unit, such as a hard disk drive (hereinafter referred to as HDD).

BACKGROUND OF THE INVENTION

Since an operating system (hereinafter referred to as OS) for an information processor is contained in an external storage unit, such as an HDD, if the HDD itself or the content of the HDD is destroyed, the information processor cannot be started.

As a precaution against such an accident, a duplicate of the contents of the external storage unit is usually retained in a tape unit or the like. Such a duplicate is called a backup.

Figure 10:
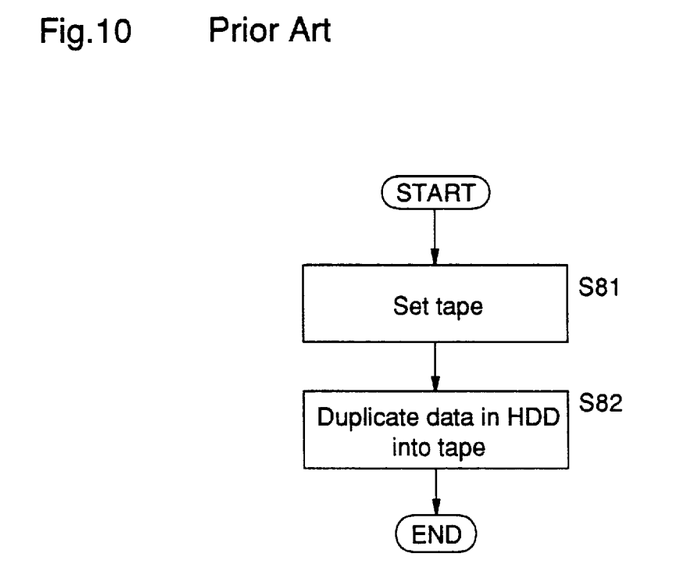
FIG. 10 is a flowchart illustrating a procedure for generating a backup using a conventional backup unit.

A description is given of a procedure for generating a backup with reference to FIG. 10. Initially, a tape unit for backup is mounted on an information processor equipped with an HDD (step S81). Then, data in the HDD is copied to backup tapes (step S82). In this method, two backup tapes are employed, i.e., a tape to which the OS of the HDD is copied and a tape to which user's data is copied. Hereinafter, the former is called an OS installation tape and the latter is called a user's data tape.

Figure 11:
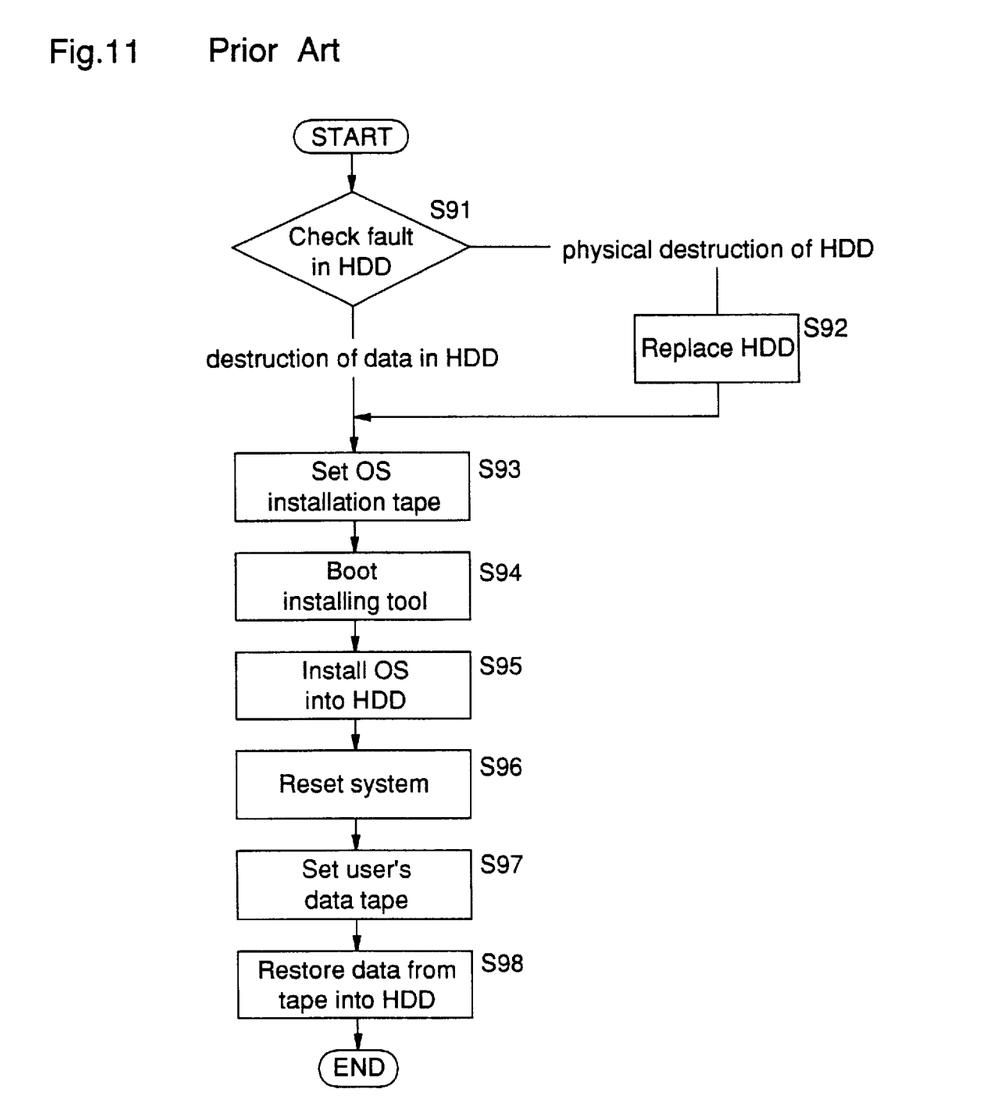
FIG. 11 is a flowchart illustrating a procedure of a countermeasure against a fault in the conventional backup unit.

When the HDD has a fault after generation of the backup, a user executes a procedure shown in FIG. 11, as a countermeasure against the fault.

Initially, the user checks the extent of the fault (step S91). When the fault is destruction of data stored in the HDD, the user immediately sets the OS installation tape in a tape drive unit which is mounted on the information processor (step S93). When the HDD itself is destroyed physically, the user replaces the HDD with another one (step S92) and sets the OS installation tape (step S93). Thereafter, the user starts an OS installing tool from the OS installation tape (step S94), whereby the OS is installed in the HDD (step S95).

Further, the user resets the system of the information processor according to his work (step S96). Thereafter, the user sets the user's data tape (step S97) and restores the data from this tape into the HDD (step S98).

Another countermeasure against the fault in the external storage unit is to duplicate the external storage unit. More specifically, two external storage units having equal performances are prepared, and data of the same contents are written in both the external storage units simultaneously. In this case, even when one of the external storage units is out of order, the user can operate the information processor continuously using the other storage unit operating normally.

However, the conventional method employing the backup tapes have the following drawbacks.

Firstly, when the external storage unit is destroyed, since the external storage unit must be replaced with another one, the operation of the information processor is stopped until the replacement is completed.

Secondly, when the contents of the external storage unit are destroyed, after reinstallation of the OS, the user resets the system of the information processor according to his work, so that resetting of the present file is necessary. For the resetting, the operation of the information processor must be stopped for half a day.

On the other hand, the method of duplicating the external storage unit has the following drawback.

In this method, since data of the same contents are written simultaneously, two (first and second) external storage units having equal writing performances must be used. Hence, it is impossible to use an expensive and high-speed HDD as the first storage unit while using an inexpensive and low-speed optical disk for the second storage unit. Therefore, the cost of the external storage units is doubled according to the amount of data duplicated.

SUMMARY OF THE INVENTION

It is an object of the present invention to provide a backup unit equipped with first and second storage means, that enables temporary operation of an information processor using the second storage means when the first storage means is out of order, and that reduces the time during which the operation of the information processor is stopped.

It is another object of the present invention to provide a backup unit employing, for the second storage means, a storage unit having a writing speed lower than that of the first storage means.

It is a further object of the present invention to provide a backup unit that facilitates restoration of the contents of the first storage means from the contents of the second storage means.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a backup unit comprises a first storage means containing at least one program and a setup file in which the operating environment of this program is written; a second storage means used when the first storage means has a fault; a duplication means for duplicating the program and the setup file contained in the first storage means, into the second storage means; and an identifier conversion means for converting identifiers included in the setup file of the first storage means and relating to the first storage means, into identifiers relating to the second storage means, when the duplication is performed. Therefore, when the operation of an information processor is stopped due to a fault in the first storage means, the second storage means enables temporary operation of the information processor. In addition, it is possible to employ, as the second storage means, a recording medium that is lower in price and writing speed than the first storage means.

According to a second aspect of the present invention, the above-mentioned backup unit further comprises a setup file managing means for judging whether at least one setup file contained in the first storage means has been updated. When the setup file managing means judges that the setup file has been updated, the duplication means duplicates the updated file of the first storage means, into the second storage means. Therefore, it is possible to store the latest setup file without troubling the user.

According to a third aspect of the present invention, the above-mentioned backup unit further comprises a switch means for selecting one of the first storage means and the second storage means as a storage means for booting. Therefore, when the operation of an information processor is stopped due to a fault in the first storage means, the second storage means enables temporary operation of the information processor without bothering the user with conversion of identifiers and other processes, so that the time during which the operation is stopped is reduced.

According to a fourth aspect of the present invention, the above-mentioned backup unit further comprises a fault detecting means for detecting a fault in the first storage means. When a fault is detected in the first storage means by the fault detecting means, the switch means selects the second storage means as a storage means for booting. Therefore, when the operation of an information processor is stopped due to a fault in the first storage means, the second storage means enables temporary operation of the information processor without troubling the user.

According to a fifth aspect of the present invention, in the above-mentioned backup unit, the program includes at least a program of an operating system, and the setup file includes at least a setup file of the operating system.

According to a sixth aspect of the present invention, the above-mentioned backup unit further comprises means for designating one of the first storage means and the second storage means as a source of duplication while designating the other as a target of duplication, and the duplication means duplicates the program and the setup file in the storage means designated as a source of duplication, into the storage means designated as a target of duplication. Therefore, data in the backup storage means can be restored in the other storage means. In addition, changes given to the data in the backup storage means during the temporary operation thereof are reflected in the restored data.

DETAILED DESCRIPTION OF THE PREFERRED EMBODIMENTS

[Embodiment 1]

Figure 1:
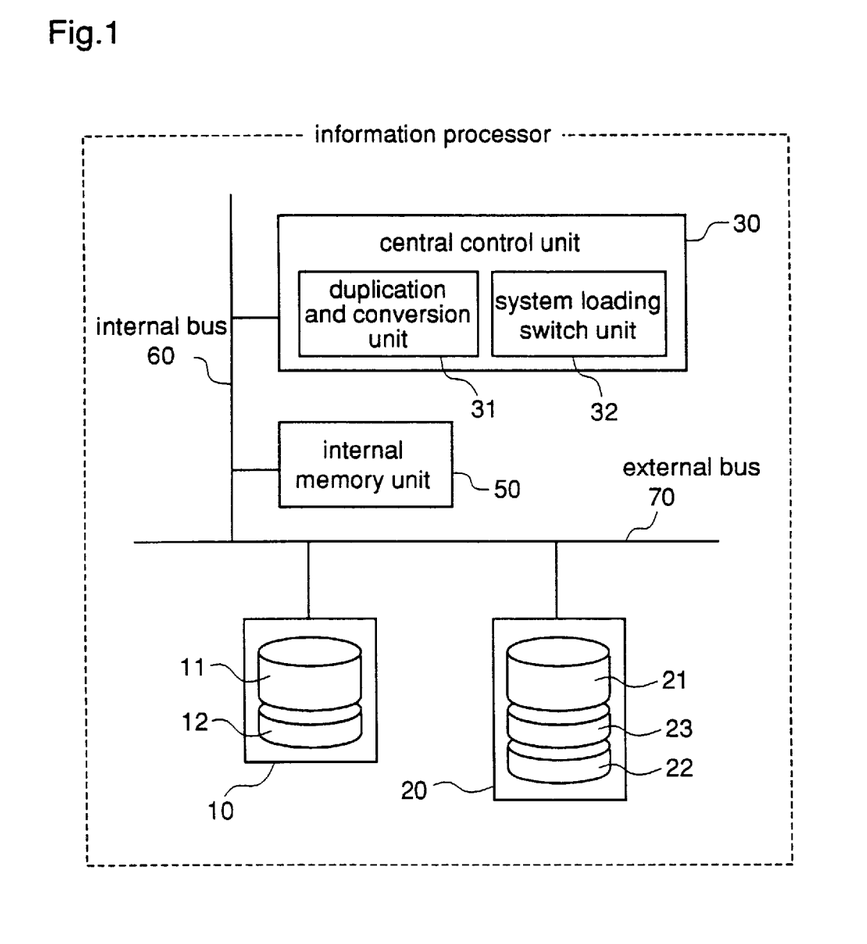
FIG. 1 is a block diagram illustrating an information processor employing a backup unit according to a first embodiment of the invention.

FIG. 1 is a block diagram illustrating an information processor employing a backup unit according to a first embodiment of the invention.

The backup unit comprises a first HDD 10 serving as a storage means when the information processor operates normally, a second HDD 20 serving as a storage means when the first HDD 10 is out of order, a central control unit 30 for instructing duplication of data and other processes, and an internal memory unit 50.

The first HDD 10 contains an OS 11 and a setup file 12 on the basis of the OS 11. The second HDD 20 contains an OS 21 which is a duplicate of the OS 11, a setup file 22 which is a duplicate of the setup file 12, and a setup file 23 which is obtained by converting the setup file 12.

The central control unit 30 comprises a duplication and conversion unit 31 for duplication of data, conversion of data, and other processes, and a system loading switch unit 32 for selecting one of the HDD 10 and the HDD 20 as a storage unit for booting (i.e., starting).

The first HDD 10, the second HDD 20, the central control unit 30, and the internal memory unit 50 are connected with each other through an internal bus 60 and an external bus 70.

Figure 2:
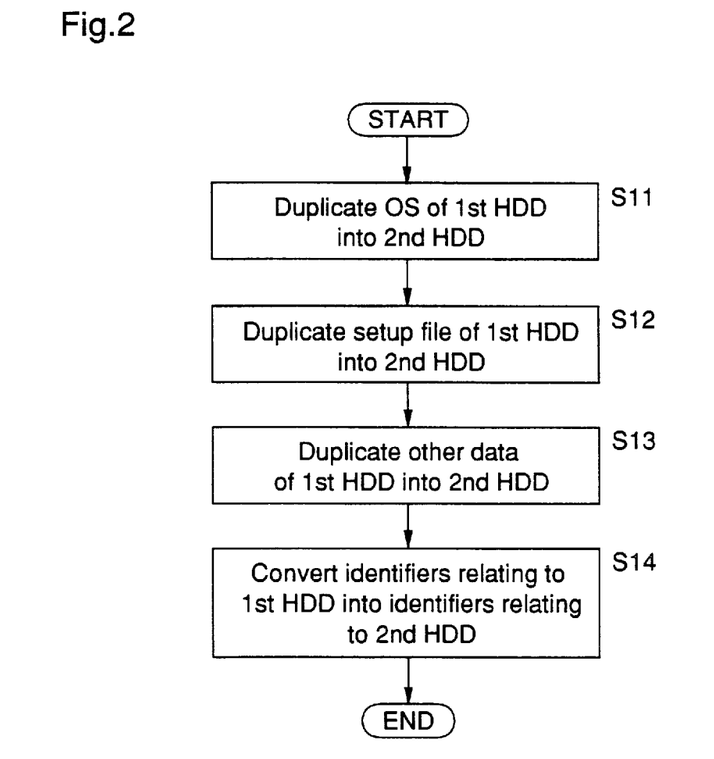
FIG. 2 is a flowchart illustrating a procedure for generating a backup using the backup unit according to the first embodiment.
Figure 3:
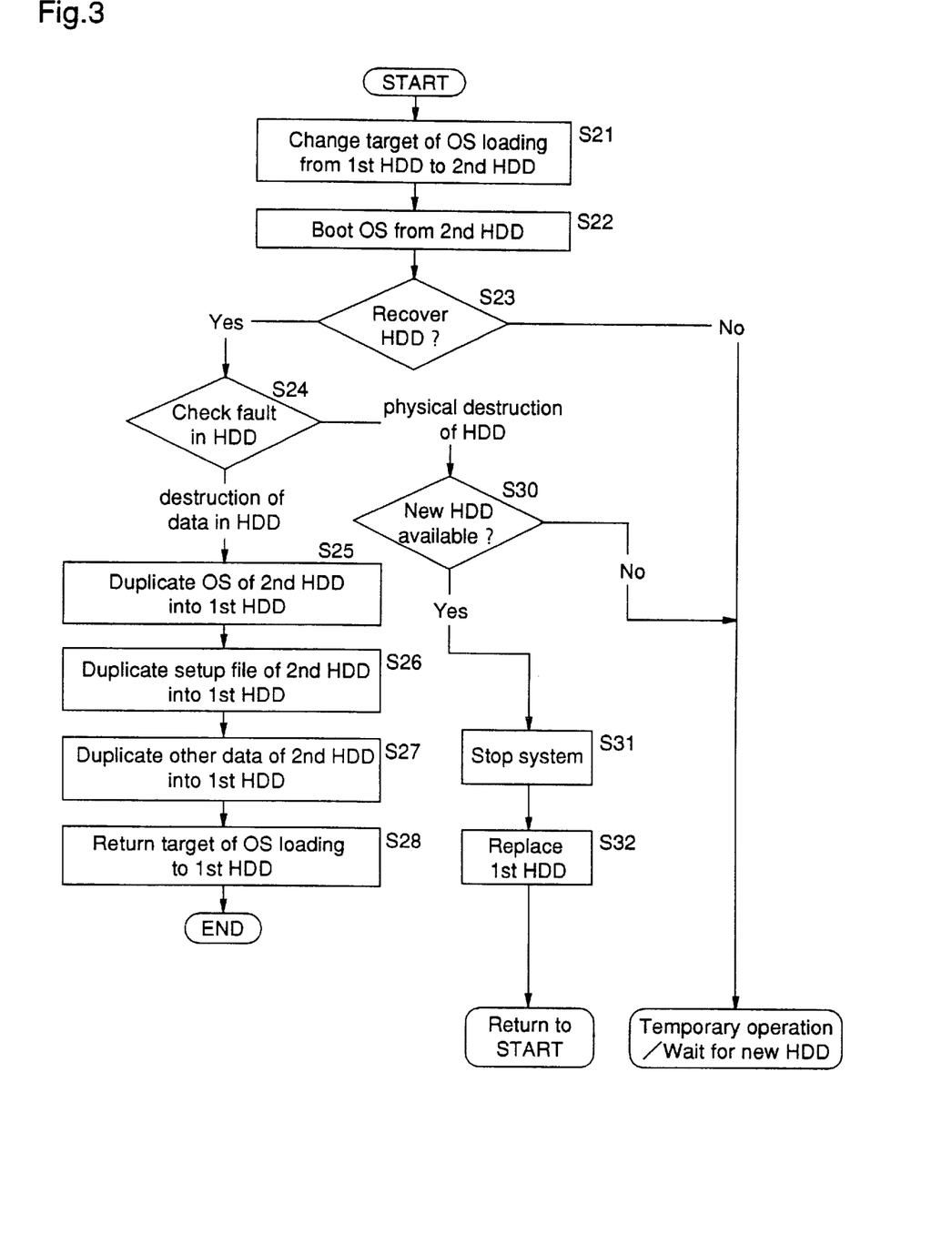
FIG. 3 is a flowchart illustrating a procedure of a countermeasure against a fault in the backup unit according to the first embodiment.
Figure 4:
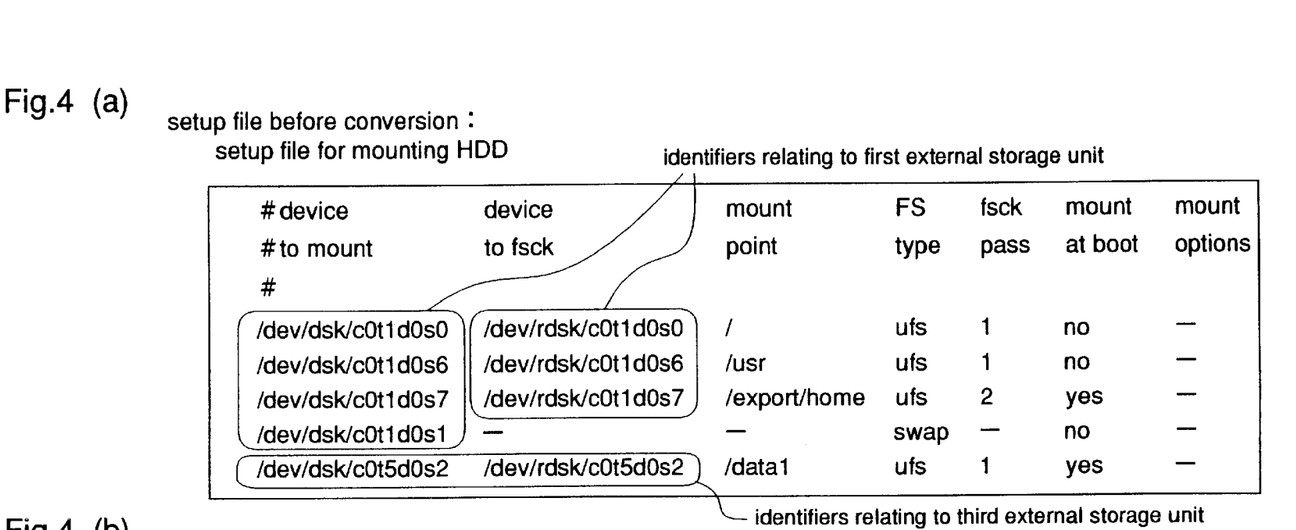
FIGS. 4(a) and 4(b) are tables illustrating a setup file before conversion by the backup unit according to the first embodiment and a setup file after the conversion, respectively.

In the information processor equipped with the backup unit so constructed, when the first HDD 10 has a fault, the user takes a countermeasure against the fault, which will be described hereinafter using FIGS. 2, 3, and 4(a) and 4(b). FIG. 2 is a flowchart showing a procedure for generating a backup using the backup unit according to the first embodiment. FIG. 3 is a flowchart showing a procedure of a countermeasure adopted by the user when the HDD 10 has a fault. FIG. 4(a) shows an example of a setup file 12 before it is converted by the backup unit, and FIG. 4(b) shows an example of a setup file 23 after conversion.

First of all, a procedure for generating a backup against a fault in the HDD 10 will be described using FIG. 2.

The user instructs the duplication and conversion unit 31 to duplicate and convert the contents of the first HDD 10. Receiving the instruction, the duplication and conversion unit 31 duplicates the OS 11 to generate the OS 21 (step S11) and duplicates the setup file 12 to generate the setup file 22 (step S12). When the HDD 10 contains user's data, this data is also duplicated and stored in the HDD 20 (step S13).

Thereafter, as shown in FIGS. 4(a) and 4(b), the duplication and conversion unit 31 converts a portion of data in the setup file 22 in the HDD 20, which portion is coded in device identifiers of the HDD 10, into data coded in device identifiers of the HDD 20, thereby generating the setup file 23 (step S14). After the conversion, the duplication and conversion unit 31 stores the setup file 23 in the HDD 20 to complete the backup.

In case where the information processor includes a third external storage unit (not shown), the setup file 12 includes device identifiers of the third storage unit, but these device identifiers are not converted.

Next, the process of user's countermeasure against the fault in the HDD 10 will be described using FIG. 3.

When the HDD 10 has a fault, the user changes the target of OS loading from the first HDD 10 to the second HDD 20 by the system loading switch unit 32 (step S21), and the user loads the OS 21 and the setup file 23 to boot the system from the second HDD 20 (step S22). Then, the user decides whether the HDD 10 should be recovered or not (step S23). When the decision is not to recover the HDD 10, the user operates the information processor temporarily using the second HDD until an HDD for replacement is prepared.

On the other hand, when the decision is to recover the HDD 10, the user judges the extent of the fault in the HDD 10 (step S24). When the HDD 10 is physically destroyed and another HDD for replacement is not available soon (step S30), the user operates the information processor temporarily using the second HDD until an HDD for replacement is prepared. When an HDD for replacement is available, the user stops the operation of the system (step S31) and replaces the first HDD 10 with the new HDD (step S32). Then, the user returns to step S21.

When the fault is destruction of data in the HDD 10, the user restores the contents of the HDD 10. In this case, it is necessary to restore the contents of the HDD 20 into the HDD 10. Hereinafter, a procedure of regenerating the first HDD 10 using the system booted for the temporary operation of the second HDD 20 will be described.

Initially, the user designates the second HDD 20 as a source of duplication and conversion and the first HDD 10 as a target of duplication and conversion. Then the user instructs the duplication and conversion unit 31 to duplicate the contents of the second HDD 20 into the first HDD 10. Receiving the instruction, the duplication and conversion unit 31 duplicates the OS 21 to generate the OS 11 (step S25) and duplicates the setup file 22 to generate the setup file 12 (step S26). When the HDD 20 contains user's data, this data is also duplicated and stored in the HDD 10 (step S27). Finally, the target of OS loading is returned to the first HDD 10 by the system loading switch unit 32 (step S28).

In the above-mentioned backup unit, the HDD 10 (first storage means) contains at least one program and a setup file in which an operating environment of this program is written. The duplication and conversion unit 31 (duplication means) duplicates the program and the setup file of the first HDD 10 into the second HDD 20 (second storage means). When the setup file is duplicated, if the setup file includes identifiers relating to the first HDD 10, the duplication and conversion unit 31 (identifier conversion means) converts these identifiers to identifiers relating to the second HDD 20. Further, the system loading switch unit 32 (switch means) selects the second HDD 20 as a storage unit for booting and boots the system from the second HDD 20. Therefore, it is possible for the user to operate the information processor temporarily, so that the inoperable time of the information processor can be reduced.

Furthermore, the duplication and conversion unit 31 (designation means) designates the second HDD 20 as a source of duplication and the first HDD 10 as a target of duplication, and duplicates the contents of the second HDD 20 into the first HDD 10. Therefore, the contents of the backup storage unit can be restored into the other storage unit. In addition, any changes to the data in the backup storage unit which data has been temporarily operated upon will be reflected in the restored data.

[Embodiment 2]

Figure 5:
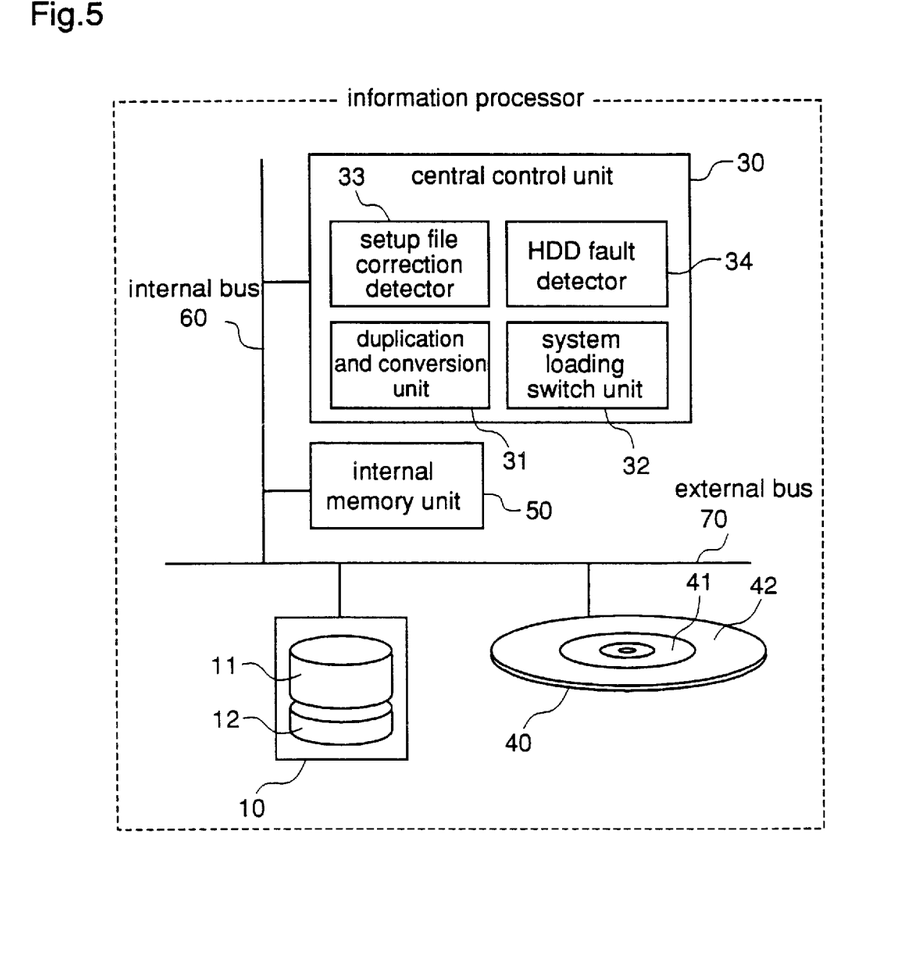
FIG. 5 is a block diagram illustrating an information processor employing a backup unit according to a second embodiment of the invention.

FIG. 5 is a block diagram illustrating an information processor employing a backup unit according to a second embodiment of the present invention.

The backup unit comprises an HDD 10 serving as a first storage means when the information processor operates normally, a rewritable optical disk 40 serving as a second storage means when the first HDD 10 is out of order, a central control unit 30 for instructing duplication of data and other processes, and an internal memory unit 50.

The HDD 10 contains an OS 11 and a setup file 12 on the basis of the OS 11. The optical disk 40 contains an OS 41 which is a duplicate of the OS 11 and a setup file 42 which is a duplicate of the setup file 12.

The central control unit 30 comprises a duplication and conversion unit 31 for duplication of data, conversion of data, and other processes, a system loading switch unit 32 for selecting one of the HDD 10 and the optical disk 40 as a storage unit for booting, a setup file correction detector 33, and an HDD fault detector 34.

The HDD 10, the optical disk 40, the central control unit 30, and the internal memory unit 50 are connected with each other through an internal bus 60 and an external bus 70.

Figure 6:
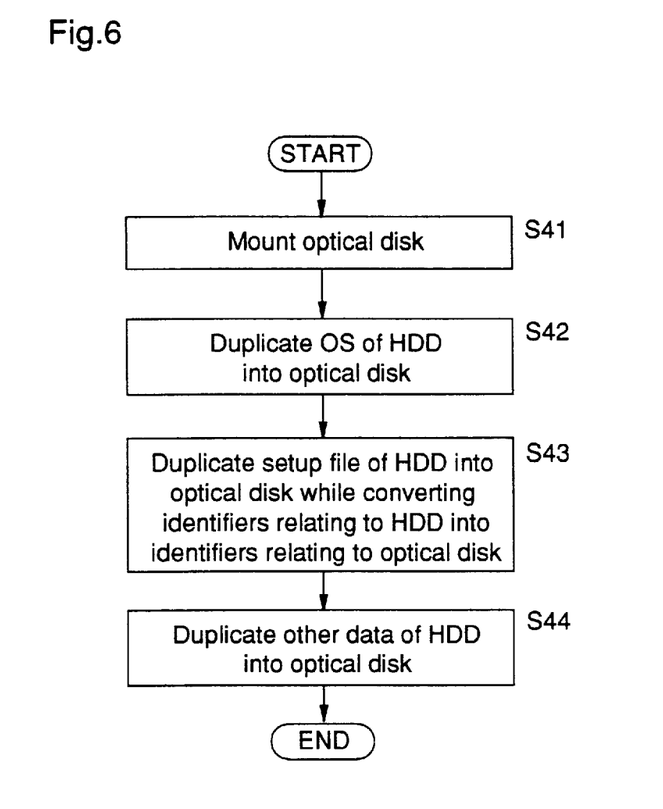
FIG. 6 is a flowchart illustrating a procedure for generating a backup using the backup unit according to the second embodiment.
Figure 7:
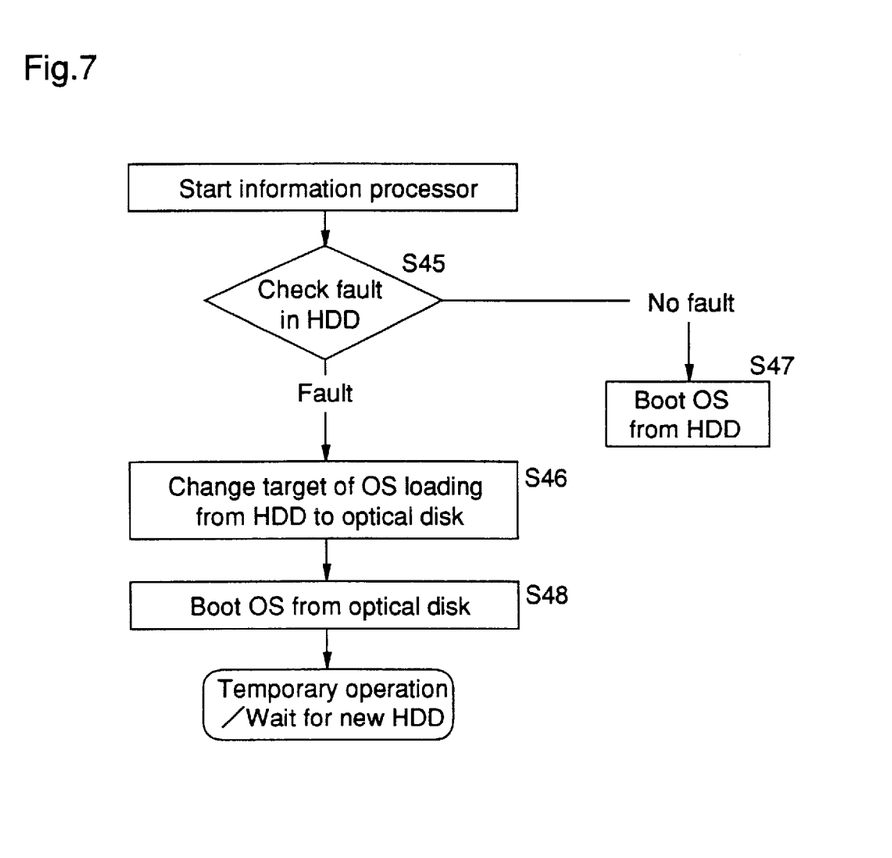
FIG. 7 is a flowchart illustrating a procedure for detecting a fault in the backup unit according to the second embodiment when the information processor is started.
Figure 8:
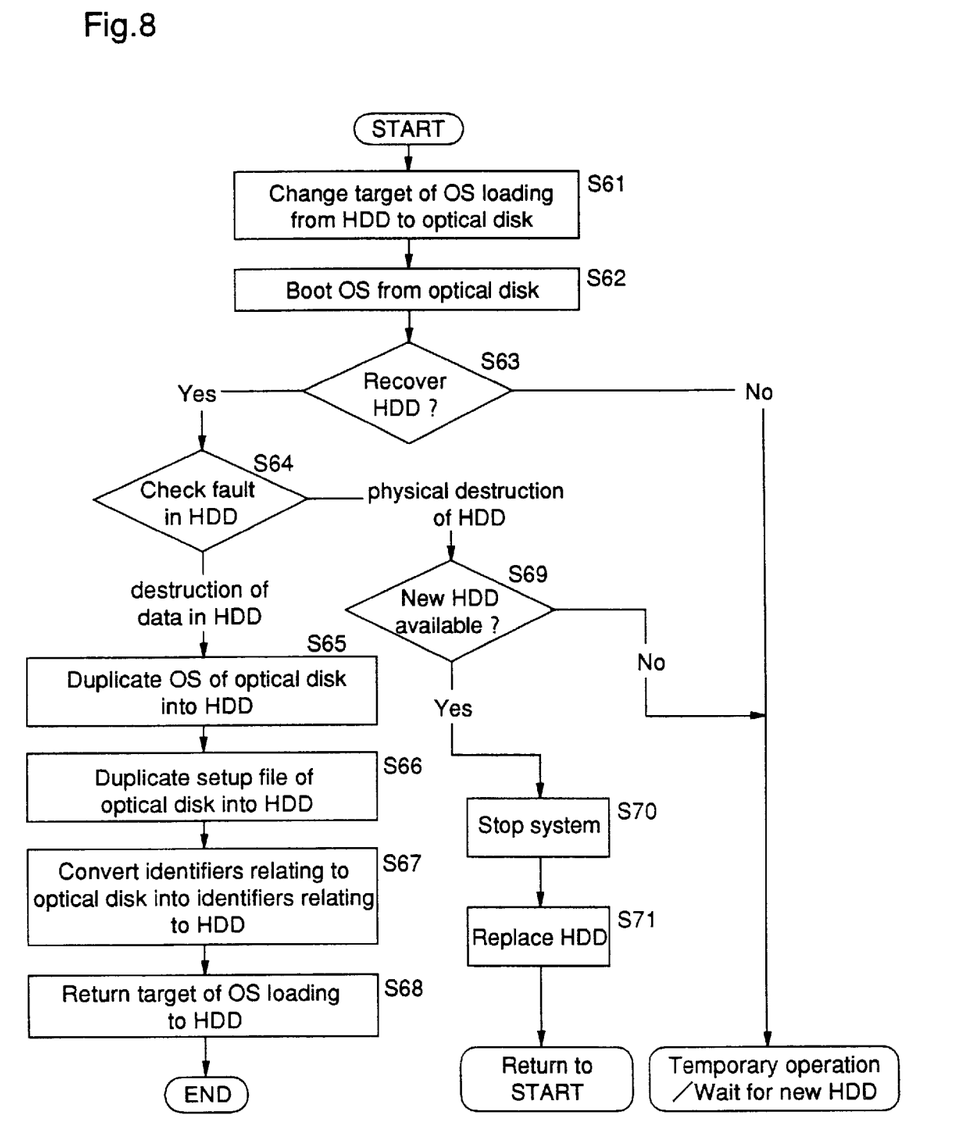
FIG. 8 is a flowchart illustrating a procedure of a countermeasure against a fault in the backup unit according to the second embodiment.
Figure 9:
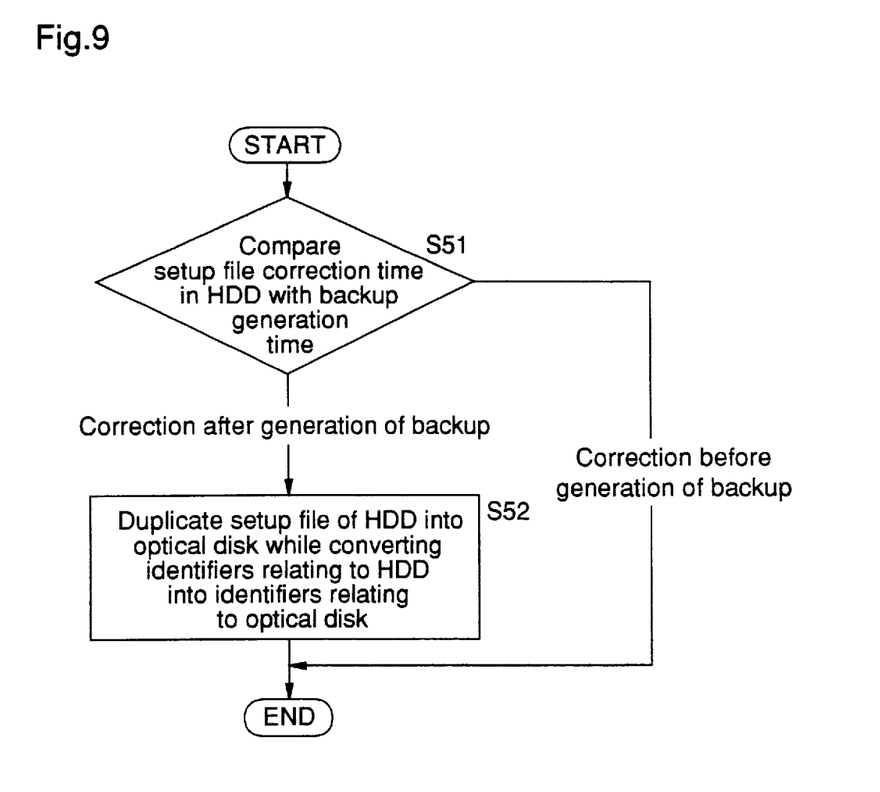
FIG. 9 is a flowchart illustrating a procedure for updating backup data by the backup unit according to the second embodiment.

In the information processor equipped with the backup unit so constructed, when the HDD 10 has a fault, the user takes a countermeasure against the fault, which will be described hereinafter using FIGS. 6 through 8. FIG. 6 is a flowchart showing a procedure for generating a backup using the backup unit according to the second embodiment. FIG. 7 is a flowchart showing the operation of the HDD fault detector 34 when the information processor is started. FIG. 8 is a flowchart showing a procedure of a countermeasure against HDD fault. FIG. 9 is a flowchart showing a procedure for updating a backup.

First of all, a procedure for generating a backup against HDD fault will be described using FIG. 6.

The user mounts the rewritable optical disk 40 as a second storage means (step S41) and instructs the duplication and conversion unit 31 to duplicate and convert the contents of the HDD 10. Receiving the instruction, the duplication and conversion unit 31 duplicates the OS 11 to generate an OS 41 (step S42). Subsequently, the unit 31 generates a setup file 42 by converting a portion of data in the setup file 12, which portion is coded in device identifiers of the HDD 10, into data coded in device identifiers of the optical disk 40, and stores the setup file 42 in the optical disk 40 (step S43). In this second embodiment, in order to save the storage region of the optical disk 40, duplication of the setup file 12 is not performed. When the HDD 10 contains user's data, this data is also duplicated and stored in the optical disk 40 (step S44).

Next, the operation of the HDD fault detector 34 will be described using FIG. 7.

When the information processor is started, the HDD fault detector 34 judges whether the HDD 10 has a fault or not by detecting, for example, "reading or writing error" of the HDD 10 or "access time out" to the HDD 10 (step S45). When the HDD 10 has no fault, the information processor is started by the HDD 10 (step S47). On the other hand, when the HDD 10 has a fault, the HDD fault detector 34 instructs the system loading switch unit 32 to change the target of OS loading from the HDD 10 to the optical disk 40 (step S46). The system loading switch unit 32 loads the OS 41 and the setup file 42 to boot the system from the optical disk 40 (step S48). Thereafter, the information processor is operated temporarily by the optical disk 40 until the HDD 10 is replaced with another HDD.

After the detection of the HDD fault, the user takes a countermeasure against the fault, which will be described hereinafter using FIG. 8.

When a fault is detected in the HDD 10, the user changes the target of OS loading from the HDD 10 to the optical disk 40 by the system loading switch unit 32 (step S61), and the user loads the OS 41 and the setup file 42 to boot the system from the optical disk 40 (step S62). Then, the user decides whether the HDD 10 should be recovered or not (step S63). When the decision is not to recover the HDD 10, the user operates the information processor temporarily using the optical disk 40 until an HDD for replacement is prepared.

On the other hand, when the decision is to recover the HDD 10, the user judges the extent of the fault (step S64). When the HDD 10 is physically destroyed and an HDD for replacement is not available soon (step S69), the user operates the information processor temporarily using the optical disk 40 until an HDD for replacement is prepared. If an HDD for replacement is available, the user stops the operation of the system (step S70) and replaces the HDD 10 with the new HDD (step S71). Then, the user returns to step S61.

When the fault is destruction of data in the HDD 10, the user restores the contents of the HDD 10. In this case, it is necessary to restore the contents of the optical disk 40 into the HDD 10. Hereinafter, a procedure of regenerating the first HDD 10 using the system booted for the temporary operation of the optical disk 40 will be described.

Initially, the user designates the optical disk 40 as a source of duplication and conversion and the HDD 10 as a target of duplication and conversion. Then, the user instructs the duplication and conversion unit 31 to duplicate and convert the contents of the optical disk 40 into the HDD 10. Receiving the instruction, the duplication and conversion unit 31 duplicates the OS 41 to generate the OS 11 (step S65) and duplicates the setup file 42 to generate the setup file 12 (step S66). At this time, the duplication and conversion unit 31 converts a portion of data in the setup file 12, which portion is coded in device identifiers of the optical disk 40, into data coded in device identifiers of the HDD 10 (step S67). When the optical disk 40 contains user's data, this data is also duplicated and stored in the HDD 10. To complete the processing, the system loading switch unit 32 returns the target of OS loading to the HDD 10 (step S68).

When data in the HDD 10 is updated, backup data corresponding to the updated, i.e., latest, data must be stored in the optical disk 40. Hereinafter, a procedure for updating backup data will be described using FIG. 9.

When the user corrects the setup file 12 in the HDD 10 during operation of the information processor, the setup file correction detector 33 detects the correction of the setup file 12 by, for example, comparing the change time of the setup file 12 with the generation time of the setup file 42 (step S51). In the case where the correction of the setup file 12 is done after the backup, the duplication and conversion unit 31 duplicates the setup file 12 in the HDD 10 into the setup file 42 in the optical disk 40 while converting identifiers relating to the HDD to identifiers relating to the optical disk (step S52), whereby the setup file 42 is updated. On the other hand, in the case where the correction of the setup file 12 is done before the backup, the setup file 12 is not updated.

As described above, according to the second embodiment of the invention, the HDD 10 (first storage means) contains at least one program and a setup file in which an operating environment of this program is written. The duplication and conversion unit 31 (duplication means) duplicates the program and the setup file of the HDD 10 into the optical disk 40 (second storage means). When the setup file includes identifiers relating to the HDD 10, the duplication and conversion unit 31 (identifier conversion means) converts these identifiers to identifiers relating to the optical disk 40. Therefore, it is possible to employ, as the second storage means, a recording medium that is lower in price and writing speed than the first storage means.

Further, when the HDD fault detector 34 (fault detecting means) detects a fault in the HDD 10, the system loading switch unit 32 (switch means) loads the OS 41 and the setup file 42 from the optical disk 40 to boot the system. Therefore, even when the operation of the information processor is stopped due to the HDD fault, the optical disk 40 enables temporary operation of the information processor without bothering the user with conversion of identifiers and other processes.

Furthermore, the setup file correction detector 33 (setup file managing means) checks whether or not the setup file in the HDD 10 is updated and, when it is updated, the updated file is duplicated in the optical disk 40. Therefore, it is possible to store the setup file 42 corresponding to the latest setup file 12, without troubling the user. In addition, when the user restores the HDD 10 using the system of the optical disk 40, which system is booted for the temporary operation, since changes given to the setup file 42 by the user during the temporary operation are reflected in the setup file 12 as latest data, the HDD 10 can be regenerated with no necessity of changing the setup file 12.

The backup unit of the present invention is not restricted to those described for the first and second embodiments. Although in the first and second embodiments an HDD or an optical disk is used as the second external storage unit, a floppy disk or a rewritable ROM, such as an EEPROM or a flash ROM, may be used with the same effects as mentioned above.

In the first and second embodiments of the invention, the duplication and conversion unit 31, the system loading switch unit 32, the setup file correction detector 33, and the HDD fault detector 34 are implemented by software, i.e., programs loaded to the central control unit 30. However, these constituents may be implemented by hardware. Further, when these constituents are implemented by software, their programs may be stored in the HDD 10. In addition, a program for generating the system loading switch unit 32 may be stored in a ROM in the information processor.

What is claimed is:

1. A backup unit comprising:
    a first storage means containing at least one program and a setup file in which the operating environment of this program is written;
    a second storage means used when the first storage means has a fault;
    a duplication means for duplicating the program and the setup file contained in the first storage means, into the second storage means; and
    an identifier conversion means for converting identifiers included in the setup file of the first storage means and relating to the first storage means, into identifiers relating to the second storage means, when the duplication is performed.

2. A backup unit as defined in claim 1 comprising:
    a setup file managing means for judging whether at least one setup file contained in the first storage means has been updated;
    wherein, when the setup file managing means judges that the setup file has been updated, the duplication means duplicates the updated file of the first storage means, into the second storage means.

3. A backup unit as defined in claim 1 comprising a switch means for selecting one of the first storage means and the second storage means as a storage means for booting.

4. A backup unit as defined in claim 3 comprising:

a fault detecting means for detecting a fault in the first storage means;

wherein, when a fault is detected in the first storage means by the fault detecting means, the switch means selects the second storage means as a storage means for booting.

5. A backup unit as defined in claims 1 wherein the program includes at least a program of an operating system, and the setup file includes at least a set file of the operating system.

6. A backup unit as defined in claim 1 comprising:

means for designating one of the first storage means and the second storage means as a source of duplication while designating the other as a target of duplication;

wherein said duplication means duplicates the program and the setup file in the storage means designated as a source of duplication, into the storage means designated as a target of duplication.

* * * * *